United States Patent [19]
Lee et al.

[11] Patent Number: 5,745,990
[45] Date of Patent: May 5, 1998

[54] TITANIUM BORIDE AND TITANIUM SILICIDE CONTACT BARRIER FORMATION FOR INTEGRATED CIRCUITS

[75] Inventors: Chang-Ou Lee; Landon B. Vines, both of San Antonio, Tex.; Felix H. Fujishiro, San Jose, Calif.; Sigmund Koenigseder, San Antonio, Tex.

[73] Assignee: VLSI Technology, Inc., San Jose, Calif.

[21] Appl. No.: 471,253

[22] Filed: Jun. 6, 1995

[51] Int. Cl.$^6$ .................................................. H01K 3/10
[52] U.S. Cl. ............................ 29/852; 437/12; 437/192
[58] Field of Search ........................... 29/852; 437/12, 437/192

[56] References Cited

U.S. PATENT DOCUMENTS 5,348,894  9/1994  Gnade et al. .

FOREIGN PATENT DOCUMENTS 4-14874  1/1992  Japan .
4-290224 10/1992  Japan .

OTHER PUBLICATIONS

Characteristics of TiSi$_2$ Contact to BF$_2$-deped single-silicon by J.S. Choi et al, *J. Materials Science* 28 (1993) 4878–4888.

Ting, C.Y. "TiN formed by evaporation as a diffusion barrier betwwen Al And Si", *Journal of Vacuum Science Technology*, vol. 21 No. 1, May/Jun. 1992, pp. 14–18.

C.S. Choi, G.A. Ruggles, C.M. Osburn and G.C. Xing, "Optimization and Characterization of LPCVD TiB$_2$ for ULSI Applications", *Journal of Electrochemical Society*, vol. 138, No. 10, Oct. 1991, pp. 3053–3061.

C.S. Choi, G.A. Ruggles, A.S. Shuh, G.C. Xing, C.M. Osburn, and J.D. Hunn, "Stabiity of TiB$_2$ as a Diffusion Barrier on Silicon", *Journal of Electrochemical Society*, vol. 138, No. 10, October 1991, pp. 3062–3067.

Wolf, Stanley and Richard N. Tauber, *Silicon Processing for the VLSI Era, vol. 1: Process Technology*, Lattice Press, Sunset Beach, California, 1986, pp. 57,58, 111–117, and 384–405.

Barter, M., and M–A Nicolet, "Thermal Oxidation of Transition Metal Silicides on Si: Summary"*Journal of the Electrochemical Society: Solid–State Science and Technology*, vol. 31, No. 2, Feb. 1984, pp. 371–375.

Wittmer, Marc, "Properties and microelectronic applications of thin films of refractory metal nitrides", Journal of Vacuum Science Technology, A 3 (4), Jul./Aug. 1985, pp. 1797–1803.

Primary Examiner—Carl J. Arbes
Attorney, Agent, or Firm—Clifton L. Anderson

[57] ABSTRACT

Titanium is deposited using a low-pressure chemical-vapor deposition to provide good step coverage over an underlying integrated circuit structure. A rapid thermal anneal is performed using an ambient including diborane. The rapid thermal anneal causes the titanium to interact with underlying silicon to form titanium silicide. Concurrently, the diborane reacts with the titanium to form titanium boride. A composite barrier layer results. Aluminum is deposited and then patterned together with the composite barrier layer to define a first level metalization. Subsequent intermetal dielectrics, metalization, and passivation layers can be added to form a multi-level metal interconnect structure. The titanium boride prevents the aluminum from migrating into the silicon, while the titanium silicide lowers the contact resistivity associated with the barrier layer. The relatively close match of the thermal coefficients of expansion for titanium boride and silicon provides high thermal stability.

6 Claims, 4 Drawing Sheets

TITANIUM BORIDE AND TITANIUM SILICIDE CONTACT BARRIER FORMATION FOR INTEGRATED CIRCUITS

BACKGROUND OF THE INVENTION

The present invention relates to integrated circuits and, more particularly, to the formation of metal-to-silicon contacts for integrated circuits. A major objective of the present invention is to provide an improved method for forming metal-to-silicon contacts with good thermal, electrical, and migration-barrier properties.

Much of modern progress is associated with the increasing miniaturization of integrated circuits made possible by advances in semiconductor processing technology. This miniaturization has provided integrated circuits of greater functionality (due in part to the greater number of circuits per integrated circuit) and greater speed (due in part to shorter distances between circuit elements).

Silicon is the most prevalent semiconductor material used in integrated circuit fabrication. Pure silicon is nonconductive; suitably doped silicon is semiconductive. Circuit elements, predominantly transistors, can be defined in a silicon substrate by suitably doping selected silicon regions. Circuit elements are then "integrated" using conductive interconnects and contacts.

Aluminum is a favored material for interconnects and contacts due to its high conductivity, low cost, and chemical and process compatibility. However, aluminum atoms in an aluminum contact can diffuse through an underlying doped silicon region during subsequent elevated-temperature processing steps. If the aluminum atoms penetrate a junction between the oppositely doped semiconductor regions, an unacceptably high leakage current can occur. In extreme cases, an electrical short is established. The problem with aluminum diffusion has become a greater concern as vertical and horizontal device dimensions have been reduced to accommodate greater circuit density.

Aluminum diffusion into the silicon can be constrained by adding small percentages of silicon to the aluminum. The silicon in the aluminum contact inhibits the drawing of silicon from the substrate into the contact. Therefore, substrate vacancies that would otherwise permit aluminum to diffuse into and through the substrate are not formed. However, the silicon can precipitate out of the aluminum contact. The resulting undoped silicon layer between the substrate and the aluminum can increase the contact resistance unacceptably. Furthermore, since the silicon has precipitated out, the contact can draw in substrate silicon and initiate aluminum diffusion. Thus, the silicon-enriched aluminum contact does not necessarily prevent current leakage and shorting.

An alternative approach to minimizing aluminum diffusion through an underlying active substrate region is to employ a barrier layer between the contact and the active region. The primary requirements for a diffusion barrier are that it be atomically opaque and electronically transparent. "Electronically transparent" means the barrier material should have low resistivity. "Atomically opaque" means the barrier material must have low aluminum and silicon solubilities to prevent diffusion through the barrier layer.

Among the subsequent high-temperature processing steps are the silicon dioxide dielectric depositions. Modern integrated circuits typically include at least two metalization layers and can include four or more metalization layers. Electrical isolation between the lowest metalization layer and the substrate is provided by a "submetal" dielectric. Electrical isolation between adjacent metal layers is provided by "intermetal" dielectrics. In either case, the dielectric typically consists of or includes silicon dioxide.

A higher quality silicon dioxide dielectric can be achieved using higher temperature chemical vapor depositions (e.g., 600° C. and above). Furthermore, high temperature annealing steps are desired to heal radiation damage suffered by the silicon dioxide, for example during plasma deposition and etch steps. Thus, a barrier layer should be stable at such elevated temperatures; otherwise it imposes a constraint on processing temperatures and thus on the quality of the dielectric layers.

Several types of materials have been employed as diffusion barriers including noble and near noble metals, refractory metals, and silicides, nitrides, borides and carbides thereof. Titanium-based compounds, e.g., elemental titanium (Ti), titanium nitride (TiN), titanium silicide (TiS$_2$), and titanium boride (TiB$_2$), are considered to be among the most favorable barrier materials. Titanium nitride, which is commonly used as a barrier material, has high thermal stability and resists silicon diffusion at temperatures of up to 600° C. for 20 hours. The contact resistance is low when used with a titanium silicide layer. Barriers of Al/TiN/TiS$_2$/Si fail only above 550° to 600° C. due to reaction of aluminum with the barrier layer material, forming AlN and Al$_3$Ti. Such a composite barrier can be formed by depositing TiN over Ti and then annealing so that the Ti interacts with the silicon below to form TiS$_2$, as taught by "TiN formed by evaporation as a diffusion barrier between Al and Si" by C. Y. Ting, *Journal of Vacuum Science Technology*, Vol. 21, No. 1, May/June 1992, pp. 14–18.

One problem with many possible barrier materials is that their thermal coefficients of expansion are significantly different from that of silicon. Thus, during high temperature excursions during subsequent processing and later integrated circuit operation, thermal stresses can damage a metal-to-silicon contact. This damage can result in increased resistance and lower performance or even device failure. Concern over such thermal stresses makes titanium boride, which has a thermal coefficient of expansion less than twice that of silicon, an attractive alternative barrier material.

Titanium boride has been recently evaluated favorably as a barrier material due to its high conductivity and chemical inertness at high temperatures. Titanium boride thin films have been formed by sputtering, reactive ion plating, laser-induced vapor-phase synthesis, reaction of Ti—B thin film couples, and chemical vapor deposition (CVD). The latter is favored for sub-micron integrated circuit manufacture due to stringent requirements for low thermal budget, conformal step coverage, and high-purity films. For example, titanium boride can be deposited using a low-pressure CVD (LPCVD) from a gaseous mixture of TiCl$_4$, B$_2$H$_6$, and H$_2$. See, for example: C. S. Choi, G. A. Ruggles, C. M. Osburn, and G. C. Xing, "Optimization and Characterization of LPCVD TiB$_2$ for ULSI Applications", *Journal of Electrochemical Society*, Vol. 138, No. 10, October 1991, pp. 3053–3061; and C. S. Choi, G. A. Ruggles, A. S. Shuh, G. C. Xing, C. M. Osburn, and J. D. Hunn, "Stability of TiB$_2$ as a Diffusion Barrier on Silicon", *Journal of Electrochemical Society*, Vol. 138, No. 10, October 1991, pp. 3062–3067.

The discussion of titanium nitride above suggests that improved contact resistance might result when a titanium boride layer is formed over a titanium silicide layer. The Choi et al. articles do not disclose an underlying silicide layer that is formed in conjunction with the described LPCVD process. However, the second Choi article does indicate that titanium silicide is formed during an annealing step following a sputtering of titanium boride with excess titanium (TiB$_{1.6}$). A disadvantage of the sputtering is its inferior step coverage relative to LPCVD; however, LPCVD does not provide for non-stoichiometric compositions such as TiB$_{1.6}$.

An LPCVD-compatible alternative is to apply elemental Ti followed by TiB$_2$. The silicide is then formed by the titanium during a subsequent annealing step. A disadvantage of this approach is that two depositions are required to form the barrier layer. The additional deposition step adds to processing costs and increases the opportunities for manufacturing errors (thus lowering yields). What is needed is a titanium boride barrier formation method that requires only a single deposition and yet provides for optimal step coverage.

SUMMARY OF THE INVENTION

The present invention involves rapid thermal annealing a titanium layer in a boron-bearing ambient. The boron reacts with the titanium to form titanium boride, providing an effective barrier to aluminum migration. Concurrently, the titanium reacts with silicon to form a silicide, enhancing contact resistivity.

The contacts are between silicon and aluminum or other highly conductive metal (e.g., copper and aluminum-copper alloys) for which a migration barrier is required. The conductors provide electrical connection to integrated circuit devices formed in a silicon substrate. Examples of silicon to which such contacts can be formed are monocrystalline silicon of a wafer, epitaxially grown silicon, or photolithographically defined polysilicon. In any case, titanium is deposited on the exposed silicon. While the present invention provides for alternative methods of depositing the titanium, LPCVD can be used for good step coverage.

The deposited titanium is treated with a rapid thermal anneal (RTA) in a boron-bearing ambient, e.g., diborane in helium carrier. Rapid thermal annealing (RTA) in the boron-bearing ambient yields a titanium boride layer over a titanium silicide layer. A conductor, such as aluminum, is deposited and patterned to provide the bulk contacts or vias to the underlying integrated circuit device. The titanium barrier layer can be patterned with the aluminum. Alternatively or in addition, the titanium layer can be patterned immediately after titanium deposition or after the RTA process.

Dielectric material, such as silicon dioxide, can be deposited and via/contact apertures formed therein: 1) before the titanium is deposited; 2) after the titanium is deposited, but before the RTA process; 3) after the RTA process (and, presumably, after patterning of the barrier layer) but before aluminum is deposited; or 4) after depositing and patterning of the first aluminum layer (the preferred case). In the fourth case, aluminum contacts are formed; in the first three cases, the first level of aluminum provides vias either to substrate silicon and/or to polysilicon contacts.

Preferably, the RTA in the boron-bearing ambient is sufficient to achieve the desired annealing and suicide formation. However, subsequent high-temperatures steps, for example, such as can be used for oxide dielectric depositions can contribute to further annealing and silicide formation. Optionally, the RTA process can be bifurcated so that the RTA in the boron-bearing ambient is followed by an RTA without a boron-bearing ambient. In the later case, an argon or other noble-gas ambient can be used to advance silicide formation and annealing. Conveniently, the RTA with argon ambient can be conducted in the same chamber as the RTA with the boron-bearing ambient.

Further intermetal dielectrics and metal layers can be added to provide additional metalization levels. One or more passivation layers can be added to protect the resulting multi-level metal interconnect structure.

An advantage of the present invention is that a composite barrier layer of titanium boride and titanium silicide is formed using only a single deposition. Since the deposition is not nonstoichiometric, a process with good step coverage, such as LPCVD, can be employed. Yet, the stochiometry of the barrier can be controlled according to the duration and conditions of the boron-ambient RTA. Conveniently, the titanium boride barrier material is formed in the same annealing step used to form the silicide. Thus, low contact resistance and an effective barrier to aluminum migration are formed concurrently. The resulting structure has a prolonged thermal-cycle lifetime, due to the match of the thermal coefficients of expansion for titanium boride and silicon. These and other features and advantages of the present invention are apparent from the description below with reference to the following drawings.

DESCRIPTION OF THE PREFERRED EMBODIMENTS

Figure 1:
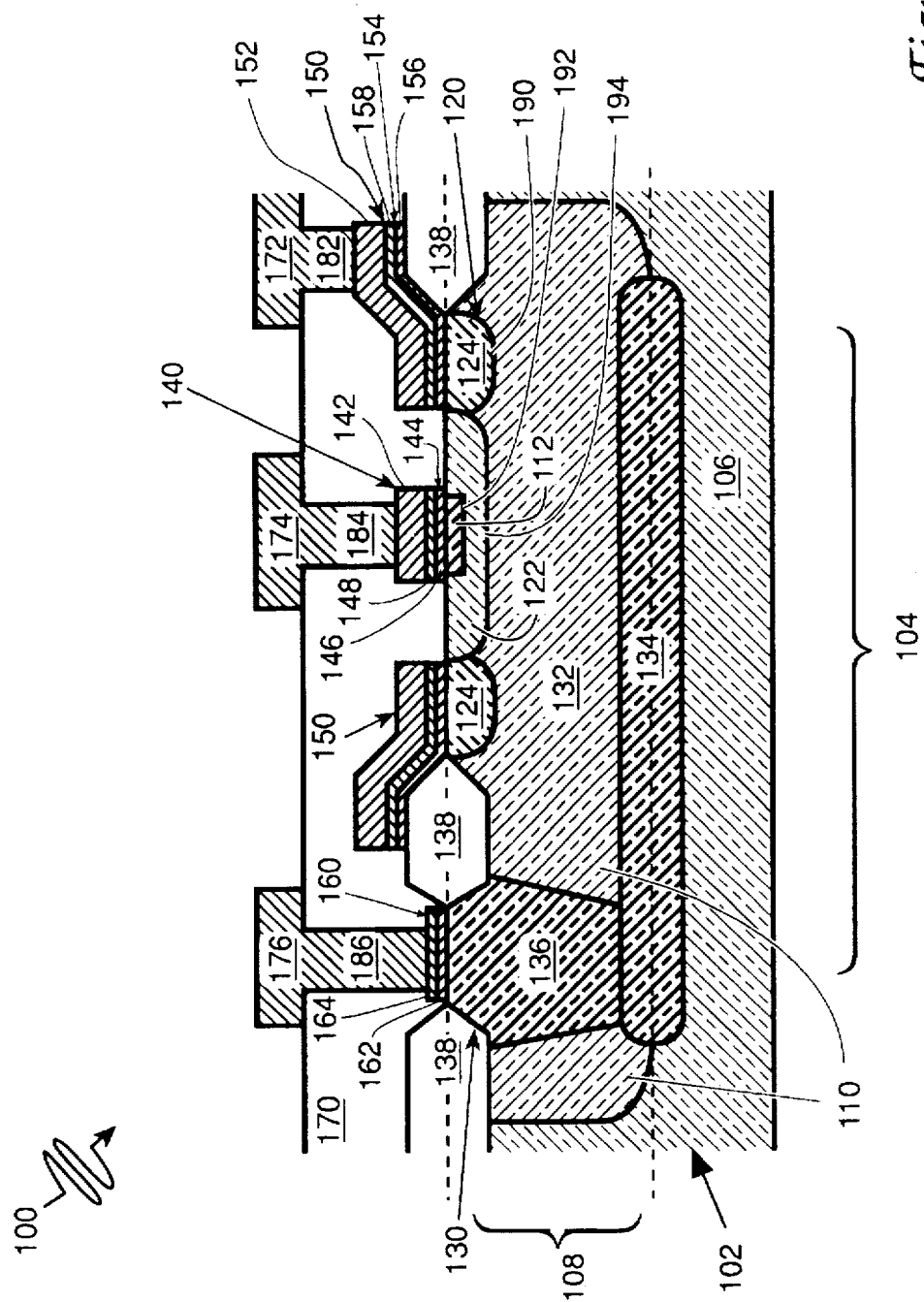
FIG. 1 is a schematic sectional view of an integrated circuit fabricated in accordance with the present invention.

An integrated circuit 100 comprises a substrate 102 in which a bipolar transistor 104 is defined, as shown in FIG. 1. Substrate 102 comprises a monocrystalline silicon wafer 106 and an epitaxial layer 108 formed thereon. The background dopings of wafer 106 and epitaxial layer 108 are light and p-type. Transistor 104 is formed within an n-well 110 of epitaxial layer 108; n-well 110 has a light net n-type dopant concentration.

Transistor 104 comprises a heavily doped n-type emitter 112, a base assembly 120 including a lightly doped p-type intrinsic base 122 and a heavily doped p-type extrinsic base 124, and a collector assembly 130 including a lightly doped n-type collector drift region 132, a heavily doped n-type subcollector 134 and a heavily doped n-type collector sink 136. Extrinsic base 124 provides electrical access to intrinsic base 122, while collector sink 136 provides electrical access to subcollector 134.

Subcollector 134 is formed from an n-type implant into wafer 106 before epitaxial layer 108 is formed. During and after formation of epitaxial layer 108, the subcollector implant diffuses both upward and downward to define subcollector 134. A light n-type doping defines n-well 110. A patterned etch and thermal oxidation forms an isolation oxide 138. A light p-type doping forms an intrinsic base region within n-well 110. A heavy p-type doping forms extrinsic base 124 radially between intrinsic base 122 and isolation oxide 138. A heavy n-type doping forms emitter 112 within the intrinsic base region, the remainder of which defines intrinsic base 122. Collector sink 136 is similarly formed in a region spaced radially from extrinsic base 124 by isolation oxide 138.

An emitter contact assembly 140 provides electrical access to emitter 112. In accordance with the present invention, emitter contact assembly 140 includes an aluminum emitter contact 142 and an emitter contact barrier 144. Emitter contact barrier 144 is differentiated into a titanium silicide lower emitter barrier layer 146 and a titanium boride upper emitter barrier layer 148. A similarly formed base contact assembly 150 includes an aluminum base contact 152 and a contact barrier 154 including a titanium silicide lower base barrier layer 156 and a titanium boride upper contact barrier layer. Since titanium boride forms an effective barrier to aluminum migration while titanium silicide is well known for its low contact resistance, the composite barrier is atomically opaque and electronically transparent.

Although there is no corresponding aluminum collector contact, a collector barrier 160 can be formed along with the emitter and base barriers to provide for good electrical connection of subsequently formed collector via. Collector barrier 160 includes a titanium silicide lower collector barrier layer 162 and a titanium boride upper collector barrier layer 164. Optionally, the collector barrier can be omitted, either by masking collector sink 136 during titanium deposition or by etching deposited titanium (before or after RTA processing) over collector sink 136. Illustrated collector barrier 160 is an example of the use of a barrier with a conductor formed after an intervening dielectric deposition.

A silicon dioxide dielectric layer 170 is formed over contacts 142 and 152. In accordance with the present invention, dielectric layer 170 is formed by low pressure chemical vapor deposition at about 600° C. and 0.8 Torr. Aluminum conductors 172, 174, and 176 provide interconnection between transistor 104 and other transistors of integrated circuit 100. Base conductor 172 is electrically coupled to base contact 152 by an aluminum base via 182, and emitter conductor 174 is electrically coupled to emitter contact 142 by an aluminum emitter via 184. Collector conductor 176 is electrically coupled to collector barrier 160 by a collector via 186.

Of concern herein are p/n junctions below aluminum contacts. For example, an extrinsic base junction 190 exists between the bottom of p-type extrinsic base 124 and collector drift region 132. Base barrier 154 prevents aluminum from base contact 152 from shorting junction 190. An emitter junction 192 exists between n-type emitter 112 and intrinsic base 122; further down, there is an intrinsic base junction 194 between p-type intrinsic base 122 and collector drift region 132. Composite emitter layer 144 prevents aluminum from diffusing to short junctions 192 and 194. Composite collector barrier 160 also prevents aluminum diffusion, although it is unlikely that such diffusion could be extensive enough to short any junctions.

Figure 2:
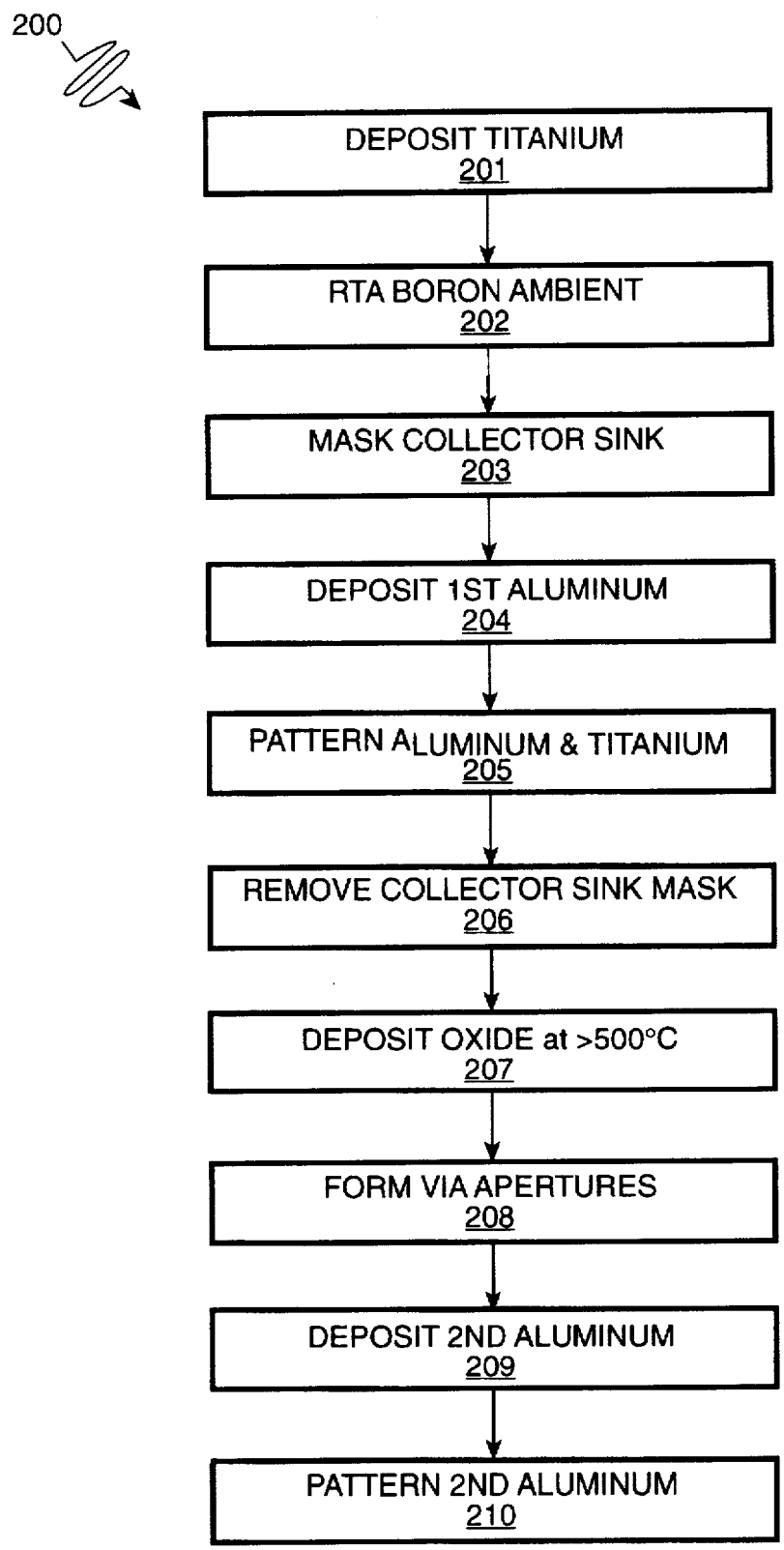
FIG. 2 is a flow chart of a method in accordance with the present invention used to fabricate the integrated circuit of FIG. 1.

A method 200 for forming conductors and dielectric on substrate 102 is illustrated in FIG. 2. Method 200 begins after the active regions, e.g., emitter 112, intrinsic base 122, extrinsic base 124, collector drift region 132, subcollector 134 and collector sink 136, are formed. Titanium is deposited, at step 201, over substrate 102 using sputter or chemical vapor deposition to a thickness of about 500 Å to about 1,500 Å, preferably about 1000 Å.

Substrate 102 is then subjected to a "rapid thermal annealing" (RTA) process in a boron-bearing gaseous ambient at step 202. This process subjects the substrate to a temperature in the range of 600° C. to 700° C. (650° C. in the present example), for about 30 to 90 seconds (60 seconds in the present example), during which the titanium reacts with the silicon substrate to form a titanium silicide barrier layer (that, after patterning provides layers 146, 156, and 162); also, titanium reacts with the boron-bearing gaseous ambient so as to yield a titanium boride barrier layer (that, after patterning, provides layers 148, 158, and 164) over the titanium silicide layer. The titanium boride layer has a thickness of about 0.06 microns (μm) to about 0.12 μm, preferably about 0.09 μm, and a relatively low resistance (25–30 ohms per contact).

Collector sink 136 is masked, at step 203, by photoresist. In a first metalization step 204, aluminum is deposited using chemical vapor deposition over the titanium boride barrier. The thickness of the aluminum layer is about 0.3 μm to about 0.7 μm, and preferably about 0.5 μm. The aluminum and unmasked titanium boride are then photolithographically patterned at step 205, forming emitter contact assembly 140 and base contact assembly 150. The collector sink mask is removed at step 206, exposing collector barrier 160.

Dielectric layer 170 is then deposited to a thickness of about 0.3 μm to 1.0 μm (preferably about 0.7 μm) using chemical vapor deposition at about 600° C., at step 207. The high temperature processing provides a higher quality dielectric while providing for additional annealing and silicide formation. At step 208, apertures are formed in dielectric layer 170 to provide access to first metalization contacts 142 and 152 and collector barrier 160. In a second metalization step 209, aluminum is deposited using chemical vapor deposition to a thickness of 50 μm over dielectric layer 170. During this metalization step 209, aluminum fills the apertures formed in step 208, forming vias 182, 184, and 186. The second metalization layer is patterned, at step 210, defining conductors 172, 174 and 176. Subsequent steps can provide additional dielectric and metal interconnect layers, as well as passivation for integrated circuit 100.

Dielectric deposition step 207 can be varied within the scope of the present invention. Different deposition techniques are provided for. The preferred embodiment provides for reaction temperatures of 500° C. and above for at least one dielectric layer. The dielectric layer can be a first intermetal dielectric layer or a later dielectric. For example, the first intermetal dielectric layer can be an organic glass, not requiring high temperature deposition. However, a subsequently formed silicon dioxide layer can be deposited at an elevated temperature above 500° C. and thus provide additional annealing and silicide formation.

Figure 3:
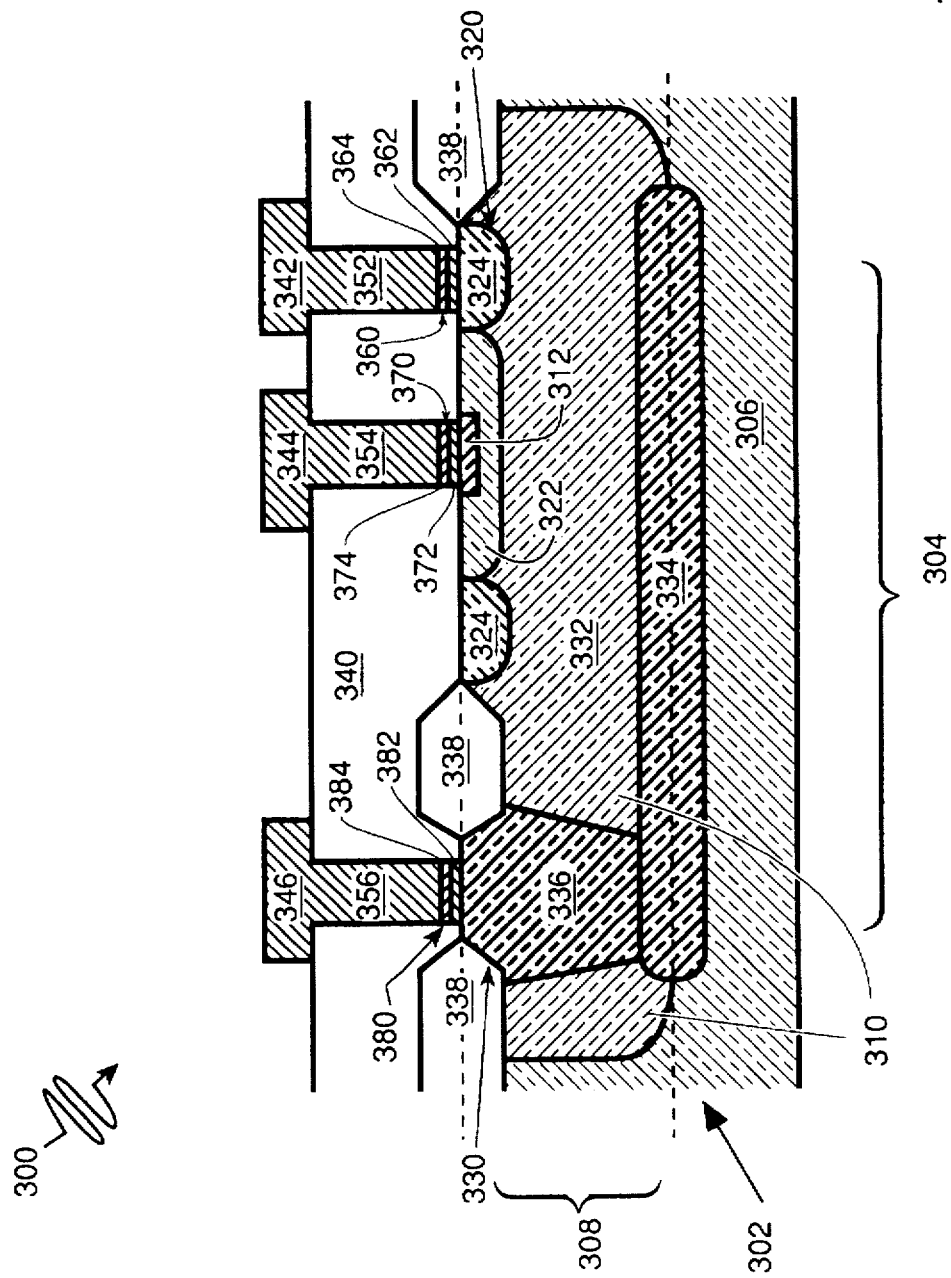
FIG. 3 is a schematic sectional view of another integrated circuit fabricated in accordance with the present invention.

An alternative integrated circuit 300, illustrated in FIG. 3, comprises a substrate 302 in which a transistor 304 is formed. The formation and structure of transistor 304 are analogous to those of transistor 104 (FIG. 1). Accordingly, transistor 304 is formed within an n-well 310 in an epitaxial layer 308. Transistor 304 comprises an emitter 312, a base assembly 320 including an intrinsic base 322 and an extrinsic base 324, and a collector assembly 330 including a collector drift region 332, a subcollector 334 and a collector sink 336. Collector sink 336 is laterally separated from extrinsic base 324 by field oxide 338.

A submetal dielectric 340 of silicon dioxide provides insulation between active transistor components and metal interconnects. A first layer of aluminum interconnects includes a base conductor 342, an emitter conductor 344, and a collector conductor 346. Base conductor 342 provides electrical connection for base assembly 320 through a respective aluminum via 352 and a respective barrier 360 that includes a titanium silicide layer 362 and a titanium boride layer 364. Emitter conductor 344 provides electrical connection for emitter 312 through a respective aluminum via 354 and a respective barrier 370 that includes a titanium silicide layer 372 and a titanium boride layer 374. Collector conductor 346 provides electrical connection for collector assembly 330 through a respective aluminum via 356 and a respective barrier 380 that includes a titanium silicide layer 382 and a titanium boride layer 384.

Figure 4:
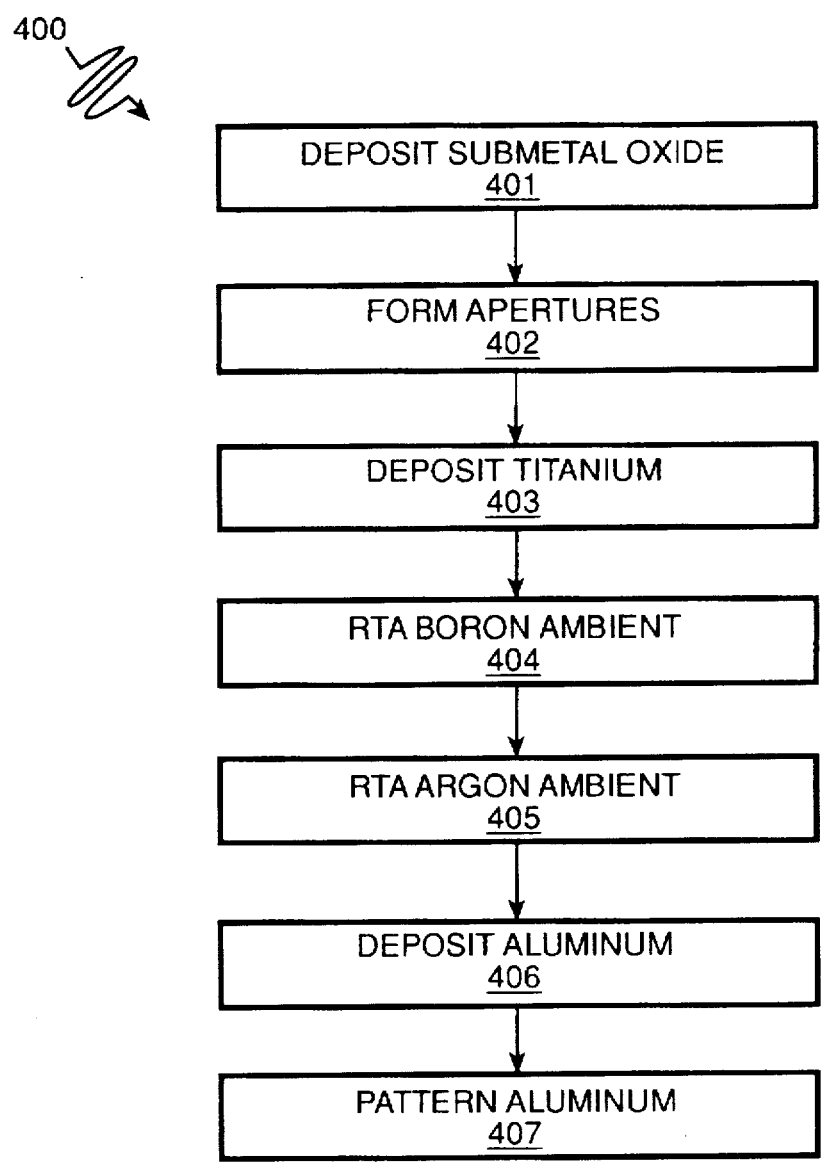
FIG. 4 is a flow chart of a method in accordance with the present invention used to fabricate the integrated circuit of FIG. 3.

A method 400 for forming integrated circuit 300 is illustrated in FIG. 4. Method 400 begins after the active regions, e.g., emitter 312, base assembly 320, and collector assembly 330, are formed. A submetal dielectric oxide is deposited at step 401. Apertures (to be filled by vias 352, 354, and 356) are formed in the dielectric at step 402 to expose emitter 312, extrinsic base 324, and collector sink 336. Titanium is deposited at step 403 using an LPCVD process for good step coverage.

An RTA process using diborane in a helium carrier is applied to form titanium boride and titanium silicide for 60 seconds at step 404. A subsequent RTA step 405 is performed for 10–30 seconds (preferably 20 seconds). The argon RTA is performed at 650° C.–750° C. at low pressure, 0.5 to 1.0 Torr (preferably, 0.8 Torr). This argon RTA provides for further annealing and silicide formation.

Aluminum is deposited at step 406 to provide for contact vias. The aluminum is patterned at step 407 to define conductors 342, 344, and 346. Subsequently, additional dielectric layers and metal patterns can be applied.

The present invention provides for different processing technologies including bipolar, MOS, BiCMOS, etc. Different semiconductor and conductor materials are provided for, such as copper and copper aluminum alloys. Of course, titanium boride works best with semiconductor materials with similar coefficients of thermal expansion such as silicon. These and other modifications to and variations upon the described embodiments are provided for by the present invention, the scope of which is limited only by the following claims.

What is claimed is:

1. In the fabrication of an integrated circuit, a method of forming a contact between a relatively highly conductive metal and silicon, said relatively highly conductive metal being more conductive than titanium, said method comprising the steps of:

depositing titanium so as to contact exposed silicon;

rapid thermal annealing in a boron-bearing ambient so as to yield titanium silicide and titanium boride to form a barrier layer; and depositing said relatively highly conductive metal over said titanium boride.

2. A method as recited in claim 1 wherein said boron-bearing ambient includes diborane.

3. A method as recited in claim 1 wherein said rapid thermal annealing step involves annealing at a temperature of at least 600° C. for between 30 and 90 seconds.

4. In the fabrication of an integrated circuit, a method of forming a contact between a relatively highly conductive metal and silicon, said relatively highly conductive metal being more conductive than titanium, said method comprising the steps of:

depositing titanium so as to contact exposed silicon;

rapid thermal annealing in a boron-bearing ambient so as to yield titanium silicide and titanium boride to form a barrier layer;

depositing said relatively highly conductive metal over said titanium boride;

patterning said highly conductive metal and said barrier layer to form contacts;

depositing an intermetal dielectric;

forming apertures in the intermetal dielectric to expose said contacts depositing a second highly conductive metal; and patterning said second highly conductive metal.

5. In the fabrication of an integrated circuit, a method of forming a contact between a relatively highly conductive metal and silicon, said relatively highly conductive metal being more conductive than titanium, said method comprising the steps of:

depositing a submetal dielectric and forming apertures in said submetal dielectric to expose underlying silicon;

depositing titanium so as to contact exposed silicon;

rapid thermal annealing in a boron-bearing ambient so as to yield titanium silicide and titanium boride to form a barrier layer; and depositing said relatively highly conductive metal over said titanium boride.

6. A method as recited in claim 5 wherein steps of depositing a dielectric and forming apertures therein to expose barrier material are performed between said step of depositing titanium and said step of depositing said relatively highly conductive metal.

* * * * *

UNITED STATES PATENT AND TRADEMARK OFFICE
CERTIFICATE OF CORRECTION

PATENT NO. : 5,745,990
DATED : May 5, 1998
INVENTOR(S) : Chang-Ou Lee et al

It is certified that error appears in the above-identified patent and that said Letters Patent is hereby corrected as shown below:

Column 8, line 25, after "contacts", add a semicolon --;--.

Signed and Sealed this

Sixth Day of October, 1998

Attest:

Attesting Officer

BRUCE LEHMAN

Commissioner of Patents and Trademarks